United States Patent
Bang et al.

(10) Patent No.: US 12,144,217 B2
(45) Date of Patent: Nov. 12, 2024

(54) DISPLAY PANEL AND DISPLAY DEVICE INCLUDING THE SAME

(71) Applicant: SAMSUNG DISPLAY CO., LTD., Yongin-si (KR)

(72) Inventors: Kiho Bang, Hwaseong-si (KR); Eunhye Kim, Namyangju-si (KR); Eunae Jung, Hwaseong-si (KR); Wonsuk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/508,964

(22) Filed: Nov. 14, 2023

(65) Prior Publication Data

US 2024/0090288 A1    Mar. 14, 2024

Related U.S. Application Data

(63) Continuation of application No. 17/352,112, filed on Jun. 18, 2021, now Pat. No. 11,818,927.

(30) Foreign Application Priority Data

Aug. 25, 2020    (KR) .................. 10-2020-0107213

(51) Int. Cl.
*H10K 59/131*     (2023.01)
*G09G 3/3266*     (2016.01)
*H10K 50/84*      (2023.01)
*H10K 59/121*     (2023.01)

(52) U.S. Cl.
CPC ......... *H10K 59/131* (2023.02); *G09G 3/3266* (2013.01); *H10K 50/841* (2023.02); *H10K 59/121* (2023.02)

(58) Field of Classification Search
CPC ................ H10K 59/121; H10K 59/131
See application file for complete search history.

(56) References Cited

U.S. PATENT DOCUMENTS

| 8,582,026 | B2 | 11/2013 | Ko et al. |
| 9,591,765 | B2 | 3/2017 | Kim et al. |
| 2019/0109184 | A1* | 4/2019 | Li ............... G06F 1/163 |
| 2019/0165309 | A1 | 5/2019 | Kim et al. |
| 2020/0302876 | A1 | 9/2020 | Shin et al. |

FOREIGN PATENT DOCUMENTS

JP    2019-015937 A    1/2019

* cited by examiner

*Primary Examiner* — Douglas M Menz
(74) *Attorney, Agent, or Firm* — Lewis Roca Rothgerber Christie LLP

(57) ABSTRACT

A display panel includes: a plurality of pixels in a display area; a plurality of data lines in the display area and extending along a first direction; a plurality of scan lines in the display area and extending along a second direction crossing the first direction; and a scan driver in a peripheral area adjacent to the display area and configured to provide a scan signal to the scan lines, wherein the peripheral area includes a corner area adjacent to a corner of the display area, and a notch area adjacent to the corner area and receding from a side of the peripheral area to form a notch, wherein a distance between the display area and an outer edge of the corner area is larger than a distance between the display area and an outer edge of the notch area.

20 Claims, 13 Drawing Sheets

DISPLAY PANEL AND DISPLAY DEVICE INCLUDING THE SAME

CROSS-REFERENCE TO RELATED APPLICATIONS

This application is a continuation of U.S. patent application Ser. No. 17/352,112, filed Jun. 18, 2021, now U.S. Pat. No. 11,818,927, which claims priority to and the benefit of Korean Patent Application No. 10-2020-0107213, filed Aug. 25, 2020, the entire content of both of which is incorporated herein by reference.

BACKGROUND

1. Field

Aspects of some embodiments of the present disclosure relate to a display panel.

2. Description of the Related Art

A display device generally includes a display panel configured to display images. Recently, various structures are being researched to improve a design of a display device and to increase an effective display area.

The above information disclosed in this Background section is only for enhancement of understanding of the background and therefore the information discussed in this Background section does not necessarily constitute prior art.

SUMMARY

Aspects of some embodiments of the present disclosure relate to a display panel. For example, some embodiments relate a display panel including a notch portion and a display device including the display panel.

Aspects of some embodiments include a display panel with a reduced non-display area.

Aspects of some embodiments include a display device including the display panel.

According to some embodiments, a display panel includes a plurality of pixels in a display area, a plurality of data lines in the display area and extending along a first direction, a plurality of scan lines in the display area and extending along a second direction crossing the first direction, and a scan driver in a peripheral area adjacent to the display area and providing a scan signal to the scan lines. The peripheral area includes a corner area, which is adjacent to a corner of the display area, and a notch area, which is adjacent to the corner area and recedes from a side of the peripheral area to form a notch. A distance between the display area and an outer edge of the corner area is larger than a distance between the display area and an outer edge of the notch area.

According to some embodiments, a width of the notch along the first direction is about 50 µm to about 150 µm.

According to some embodiments, a width of the notch along the second direction is about 50 µm to about 500 µm.

According to some embodiments, the display panel includes a bending portion, which extends from the peripheral area, and a rear portion, which extends from the bending portion and is under a front portion including the display area.

According to some embodiments, the peripheral area includes a connection area connected to the bending portion. The notch area is between the corner area and the connection area.

According to some embodiments, the display area includes a corner with a round shape or a chamfered shape.

According to some embodiments, the scan driver is arranged along a curving line or a diagonal line, which corresponds to the corner of the display area, in the corner area of the peripheral area.

According to some embodiments, the display panel further includes a scan driving wiring passing through the notch area and electrically connected to the scan driver, a first power transfer wiring passing through the notch area and transferring a first power voltage to the pixels, a plurality of power lines in the display area and electrically connected to the pixels and a second power transfer wiring in the peripheral area and electrically connected to the power lines.

According to some embodiments, the second power transfer wiring passes through the notch area.

According to some embodiments, the display panel further includes a mesh power wiring, which is in the display area, extends along the second direction, and is electrically connected to the power lines. The second power transfer wiring is not in the notch area.

According to some embodiments, the display panel further includes a connection wiring, which is in the display area and transfers a data signal to a data line adjacent to the corner area.

According to some embodiments, the connection wiring is electrically connected to the second power transfer wiring.

According to some embodiments, a portion of the connection wiring extends along the second direction to cross a data line adjacent thereto.

According to some embodiments, at least one of the first power transfer wiring or the second power transfer wiring have a dual-wiring structure including an upper wiring layer and a lower wiring layer.

According to some embodiments, the first power transfer wiring overlaps the scan driving wiring in the notch area.

According to some embodiments, at least one of the first power transfer wiring or the second power transfer wiring has a width along the first direction in the corner area, which is larger than a width along the first direction in the notch area.

According to some embodiments, a display device includes a display panel including a notch receding from a side of the display panel, a window cover combined with a front surface of the display panel, a rear cover on a rear surface of the display panel, a first water-proof member between the display panel and the rear cover, a second water-proof member between the window cover and the rear cover, and a sealing member filling a gap between the first and second water-proof members and overlapping the notch of the display panel.

According to some embodiments, a display panel includes a notch, which overlaps at least a portion of a sealing member filling a gap between water-proof members. The sealing member may contact a window cover through the notch. Thus, position of the sealing member and a bending portion may be moved or shifted toward to a display area, and a size of a non-display area may be reduced.

BRIEF DESCRIPTION OF THE DRAWINGS

Aspects of one or more embodiments of the present inventive concept will be more clearly understood from the following detailed description taken in conjunction with the accompanying drawings.

DETAILED DESCRIPTION

A display panel and a display device according to some embodiments of the present inventive concept will be described in more detail hereinafter with reference to the accompanying drawings, in which some embodiments are shown.

Figure 1:
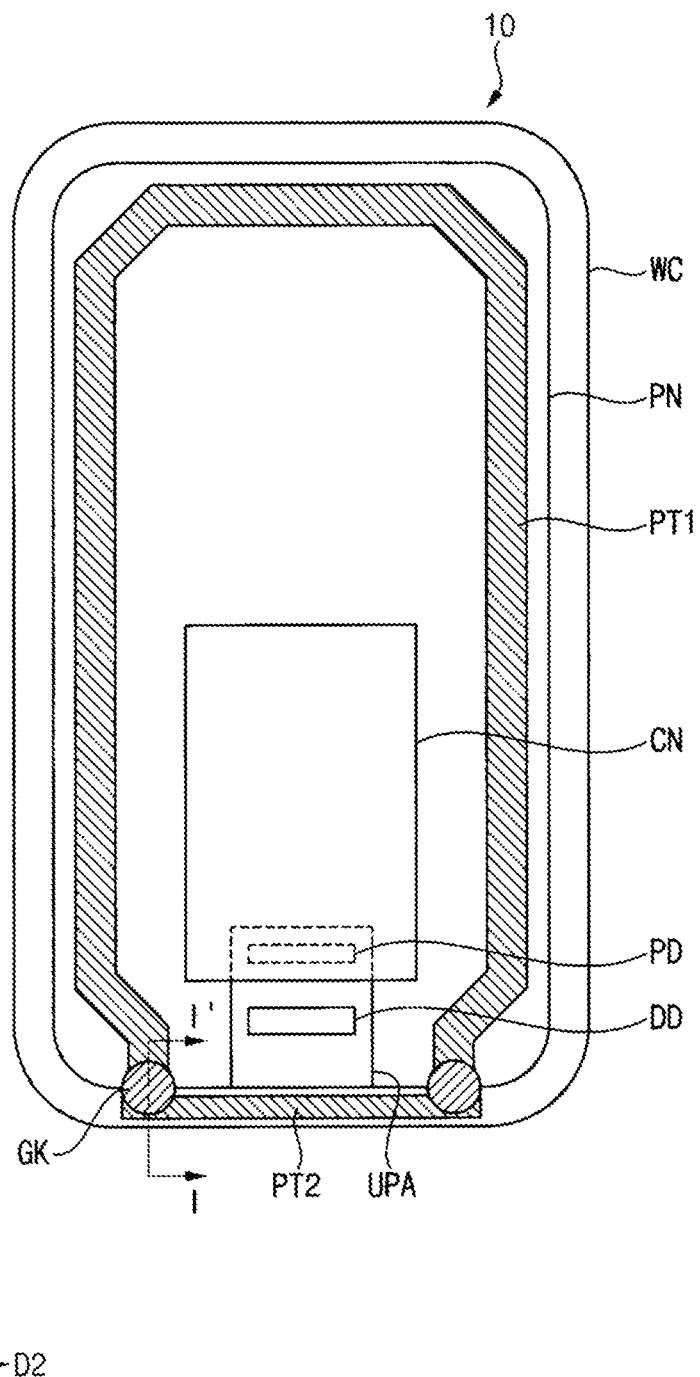
FIG. 1 is a rear view illustrating a display device according to some embodiments.
Figure 2:
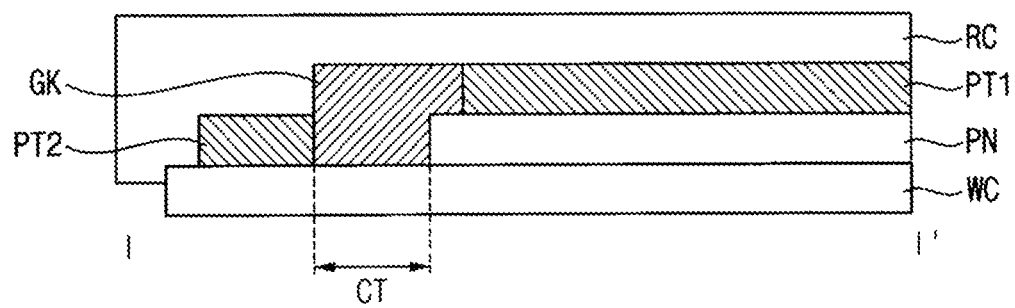
FIG. 2 is a cross-sectional view taken along the line I-I' of FIG. 1 according to some embodiments.
Figure 3:
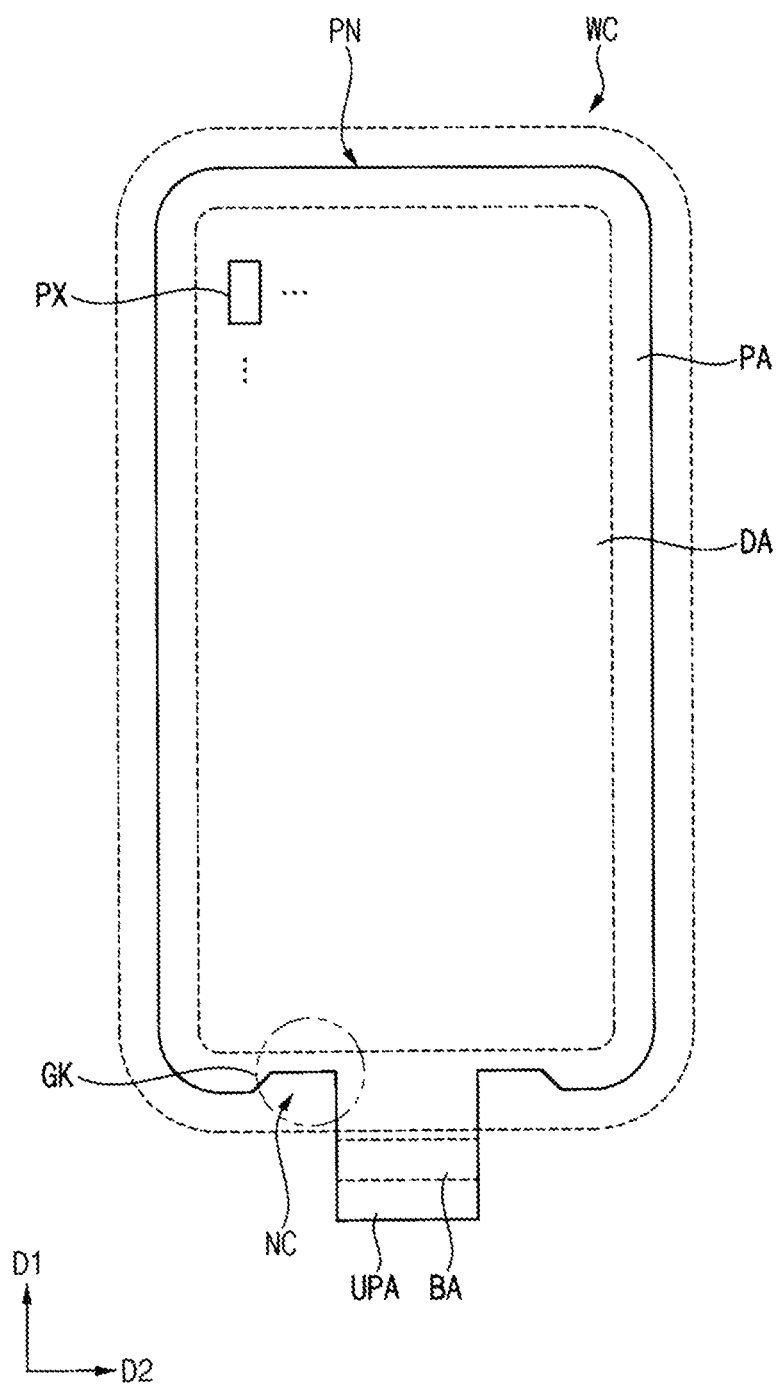
FIG. 3 is a plan view illustrating a display panel according to some embodiments.

FIG. 1 is a rear view illustrating a display device according to some embodiments. FIG. 2 is a cross-sectional view taken along line I-I' of FIG. 1. FIG. 3 is a plan view illustrating a display panel according to some embodiments. A portion of the display panel may be bent to form a bending portion. FIG. 3 may show a display panel that is unfolded without a bending portion.

Referring to FIGS. 1 to 3, a display device 10 may include a display panel PN, a window cover WC combined with a front surface (upper surface) of the display panel PN and a rear cover RC covering a rear surface (lower surface) of the display panel PN. The rear cover RC may be referred to as a housing.

The display panel PN may include a front portion combined with the window cover WC and a rear portion UPA extending from the front portion and arranged to face a rear surface of the front portion. For example, the display panel PN may further include a bending portion BA, which connects the front portion to the rear portion UPA.

The front portion includes a display area DA, in which a plurality of pixels PX are arranged to display an image. The window cover WC may include a light-transmitting area, which overlaps the display area DA. The display panel PN may be combined with the window cover WC by a transparent adhesive film.

According to some embodiments, the display panel PN may be an organic light-emitting display panel. For example, each of the pixels PX may include a light-emitting element and a driving element electrically connected to the light-emitting element. According to some embodiments, the light-emitting element may include an organic light-emitting diode, and the driving element may include at least one thin film transistor.

An area, which is adjacent to the display area DA and does not generate an image, may be referred to as a peripheral area PA. For example, the peripheral area PA may have a shape surrounding the display area DA.

According to some embodiments, the rear portion UPA of the display panel PN may be electrically connected to a driving device. For example, a driving chip DD may be mounted on the rear portion UPA. For example, the driving chip DD may include a data driver providing a data signal to the display panel PN.

A pad portion PD may be formed in the rear portion UPA. The pad portion PD may include a plurality of connection pads. The pad portion PD may be electrically connected to a control device CN. For example, the control device CN may provide a control signal to the driving chip DD. Furthermore, the control device CN may provide a power voltage, a scan driving signal or the like to the display panel PN. For example, the control device CN may include a printed circuit board. The rear portion UPA may include transfer wirings, which transfer a control signal to the driving chip DD from the pad portion PD, transfer a driving signal generated by the driving chip DD to the display area DA, and transfer a power voltage, a scan driving signal or the like to the display area DA.

The display device 10 may further include a water-proof member. For example, the water-proof member may be arranged along an edge of the display device 10. For example, the water-proof member may be a double-sided adhesive tape for both of sealing and adhesion According to some embodiments, the display device 10 may include a first water-proof member PT1 and a second water-proof member PT2. The first water-proof member PT1 may extend at least along a first direction D1, and may be located between the display panel PN and the rear cover RC. The second water-proof member PT2 may extend along a second direction D2 crossing the first direction D1, and may be located between the window cover WC and the rear cover RC.

For example, the second water-proof member PT2 may extend along a side of the display panel PN, which is adjacent to the bending portion BA. The first water-proof member PT1 may extend along other three sides of the display panel PN. However, embodiments are not limited thereto. For example, the display panel PN may include at least three water-proof members.

The rear cover RC may have a stepped structure to receive the window cover WC and the second water-proof member PT2.

The first water-proof member PT1 and the second water-proof member PT2 may be arranged at different heights to be spaced apart from each other. Thus, a sealing member GK may be provided between the first water-proof member PT1 and the second water-proof member PT2 to compensate for a gap between the first water-proof member PT1 and the second water-proof member PT2 for water-proofing. The sealing member GK may fill the gap between the first water-proof member PT1 and the second water-proof member PT2. For example, the sealing member GK may be formed from a curable resin with a high viscosity. For example, the curable resin may include a thermo-curable resin or a photo-curable resin, and may include a silicone resin, an epoxy resin, an elastomer or a combination thereof.

The sealing member GK may contact the window cover WC and the rear cover RC to increase sealing reliability. Thus, a space may be required for forming a contact area CT of the sealing member GK and the window cover WC. According to some embodiments, the display panel PN may include a notch NC overlapping the sealing member GK (e.g., in a plan view or a view perpendicular or normal with respect to a display surface of the display panel PN). For example, the front portion of the display panel PN may have a substantially rectangular shape, of which corners may be round or chamfered, in a plan view. The notch NC may be defined by an area, which recedes from a side of the front portion. For example, the sealing member GK may overlap the notch NC and an area adjacent to the notch NC.

According to some embodiments, a display panel includes a notch, which overlaps at least a portion of a sealing member filling a gap between water-proof members. The sealing member may contact a window cover through the notch. Thus, position of the sealing member and a bending portion may be moved or shifted toward to a display area, and a size of a non-display area may be reduced, while maintaining water-proof or water resistant characteristics of the display device 10.

Figure 4:
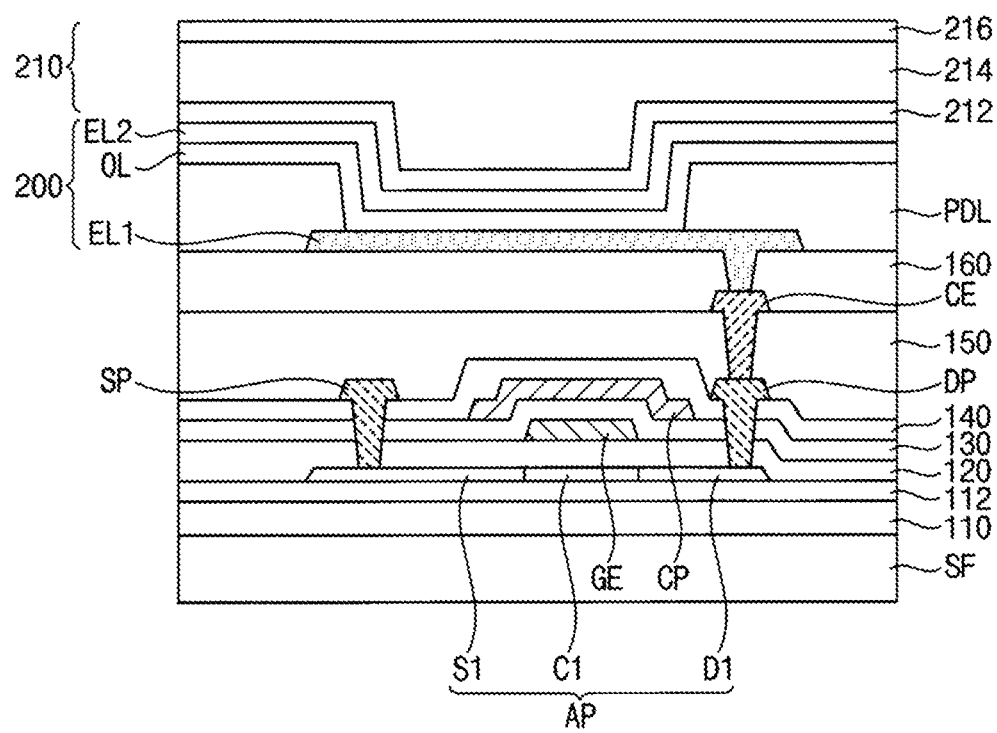
FIG. 4 is a cross-sectional view illustrating a pixel unit of a display panel according to some embodiments.

FIG. 4 is a cross-sectional view illustrating a pixel unit of the display panel PN according to some embodiments.

Referring to FIG. 4, a buffer layer 112 may be located on a base substrate 110. An active pattern AP may be located on the buffer layer 112.

According to some embodiments, the base substrate 110 may include a polymeric material. For example, the base substrate 110 may include polyethylene terephthalate, polyethylene naphthalate, polyether ketone, polycarbonate, polyarylate, polyether sulfone, polyimide, polybenzoxazole, polybenzobisoxazole, polybenzoimidazole, polybenzothiazole or a combination thereof. According to some embodiments, the base substrate 110 may have a stacked structure including a polymeric film including polyimide and a barrier layer including an inorganic material.

According to some embodiments, a supporting film SF may be located under the base substrate 110. The supporting film SF may be a polymeric film to support the base substrate 110. The supporting film SF may not be located in the bending portion BA or may include an opening overlapping the bending portion BA.

The buffer layer 112 may prevent or reduce permeation of impurities, humidity or external gas from underneath of the base substrate 110, and may reduce a roughness of an upper surface of the base substrate 110. For example, the buffer layer 112 may include an inorganic material such as silicon oxide, silicon nitride, silicon oxynitride or the like.

The active pattern AP may include a channel region C1, a source region S1 and a drain region D1. The source region S1 and the drain region D1 may function as a source electrode and a drain electrode, respectively.

A first gate metal pattern may be located on the active pattern AP. For example, the first gate metal pattern may include a gate electrode GE overlapping the channel region C1 of the active pattern AP. A first insulation layer 120 may be located between the active pattern AP and the first gate metal pattern.

A second gate metal pattern including a capacitor electrode pattern CP may be located on the first gate metal pattern. For example, the capacitor electrode pattern CP may overlap the gate electrode GE.

A second insulation layer 130 may be located between the first gate metal pattern and the second gate metal pattern. A third insulation layer 140 may be located on the second gate metal pattern.

For example, the active pattern AP may include silicon or a metal oxide semiconductor. According to some embodiments, the active pattern AP may include polycrystalline silicon (polysilicon), which may be doped with n-type impurities or p-type impurities.

According to some embodiments, an active pattern may include a metal oxide semiconductor. For example, the active pattern may include a binary compound ($AB_x$), a ternary compound ($AB_xC_y$) or a quaternary compound ($AB_xC_yD_z$), which contains indium (In), zinc (Zn), gallium (Ga), tin (Sn), titanium (Ti), aluminum (Al), hafnium (Hf), zirconium (Zr), magnesium (Mg). For example, the active pattern may include zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

For example, the first insulation layer 120, the second insulation layer 130 and the third insulation layer 140 may each include silicon oxide, silicon nitride, silicon oxynitride or a combination thereof. Furthermore, the first insulation layer 120, the second insulation layer 130 and the third insulation layer 140 may each include an insulating metal oxide such as aluminum oxide, tantalum oxide, hafnium oxide, zirconium oxide, titanium oxide or the like. For example, the first insulation layer 120, the second insulation layer 130 and the third insulation layer 140 may each have a single-layered structure or a multi-layered structure including silicon nitride and/or silicon oxide.

For example, the first gate metal pattern and the second gate metal pattern may each include a metal, a metal alloy, a metal nitride, a conductive metal oxide or the like. For example, the first gate metal pattern and the second gate metal pattern may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be located on the third insulation layer 140. The first source metal pattern may include a source pattern SP and a drain pattern DP, which electrically contact the active pattern AP. The source pattern SP and the drain pattern DP may pass through the insulation layers thereunder to contact the source region S1 and the drain region D1 of the active pattern AP, respectively. According to some embodiments, the first source metal pattern may further include at least one of a connection pattern transferring a driving signal or a mesh power line.

A fourth insulation layer 150 may be located on the first source metal pattern. The fourth insulation layer 150 may compensate for a height difference of a structure located thereunder to planarize the substrate. The fourth insulation layer 150 may include an organic material. For example, the fourth insulation layer 150 may include an organic insulation material such as a phenol resin, an acryl resin, a polyimide resin, a polyamide resin, a siloxane resin, an epoxy resin or the like. The fourth insulation layer 150 may be referred as to a first via insulation layer or a first organic insulation layer.

A second source metal pattern may be located on the fourth insulation layer 150. The second source metal pattern may include a connection electrode CE, which passes through the fourth insulation layer 150 to electrically contact the drain pattern DP. For example, the second source metal pattern may further include at least one of a data line transferring a data signal or a power line transferring the power voltage For example, the first source metal pattern and the second source metal pattern may each include a metal, a metal alloy, a metal nitride, a conductive metal oxide or the like. For example, the first source metal pattern and the second source metal pattern may each include Au, Ag, Al, Cu, Ni, Pt, Mg, Cr, W, Mo, Ti, Ta or an alloy thereof, and may have a single-layered structure or a multi-layered structure including different metal layers. According to some embodiments, the first source metal pattern and the second source metal patterns may each have a multi-layered structure including aluminum.

A fifth insulation layer 160 may be located on the second source metal pattern. The fifth insulation layer 160 may include a same material as the fourth insulation layer 150. The fifth insulation layer 160 may be referred as to a second via insulation layer or a second organic insulation layer.

A light-emitting element 200 may be located on the fifth insulation layer 160. The light-emitting element 200 may include a first electrode EL1, an organic layer OL located on the first electrode EL1 and a second electrode EL2 located on the organic layer OL. The first electrode EL1 of the light-emitting element 200 may be electrically connected to the connection electrode CE.

A pixel-defining layer PDL may be located on the fifth insulation layer 160. The pixel-defining layer PDL may include an opening overlapping at least a portion of the first electrode EL1. At least a portion of the organic layer OL may be located in the opening. The organic layer OL may include a common layer extending continuously over a plurality of pixel. According to some embodiments, the organic layer OL may be formed as an isolated pattern located in each of the pixels. The pixel-defining layer PDL may include an organic material.

The first electrode EL1 may function as an anode. The first electrode EL1 may be referred to as a pixel electrode or a lower electrode. For example, the first electrode EL1 may be formed as a transmitting electrode or a reflecting electrode according to an emission type of the display device. When the first electrode EL1 is a transmitting electrode, the first electrode EL1 may include indium tin oxide, indium zinc oxide, zinc tin oxide, indium oxide, zinc oxide, tin oxide or the like. When the first electrode EL1 is a reflecting electrode, the first electrode EL1 may include Au, Ag, Al, Cu, Ni, Pt, Mg, Cr, W, Mo, Ti or a combination thereof, and may have a stacked structure further including the material that may be used for the transmitting electrode.

The organic layer OL may at least an emission layer, and may further include at least one of a hole-injection layer (HIL), a hole-transporting layer (HTL), an electron-transporting layer (ETL), or an electron-injection layer (EIL) to have a stacked structure. The organic layer OL may include a low molecular weight organic compound, a high molecular weight organic compound or a combination thereof.

According to some embodiments, the organic layer OL may emit a red light, a green light or a blue light. According to some embodiments, the organic layer OL may emit a white light. The organic layer OL emitting a white light may have a multi-layered structure including a red light-emitting layer, a green light-emitting layer and a blue light-emitting layer, or a single-layered structure including a mixture of a red-emitting material, a green-emitting material and a blue-emitting material.

The second electrode EL2 may function as a cathode. The second electrode EL1 may be referred to as a common electrode or an upper electrode. The second electrode EL2 may be formed as a transmitting electrode or a reflecting electrode according to an emission type of the display device. For example, the second electrode EL2 may include a metal, a metal alloy, a metal nitride, a metal fluoride, a conductive metal oxide or a combination thereof.

For example, the second electrode EL2 may be formed as a common layer extending continuously over a plurality of pixels.

An encapsulation layer 210 may be located on the light-emitting element 200. The encapsulation layer 210 may have a stacked structure of an inorganic thin film and an organic thin film. For example, the encapsulation layer 210 may include a first inorganic thin film 212, an organic thin film 214 located on the first inorganic thin film 212 and a second inorganic thin film 216 located on the organic thin film 214.

For example, the organic thin film may include a cured polymer resin such as a cured acryl resin, a cured epoxy resin or the like. For example, the cured polymer resin may be formed by cross-linking reaction of monomers. For example, the inorganic thin films may include silicon oxide, silicon nitride, silicon oxynitride, aluminum oxide, tantalum oxide, hafnium oxide, zirconium oxide, titanium oxide or a combination thereof.

Figure 5:
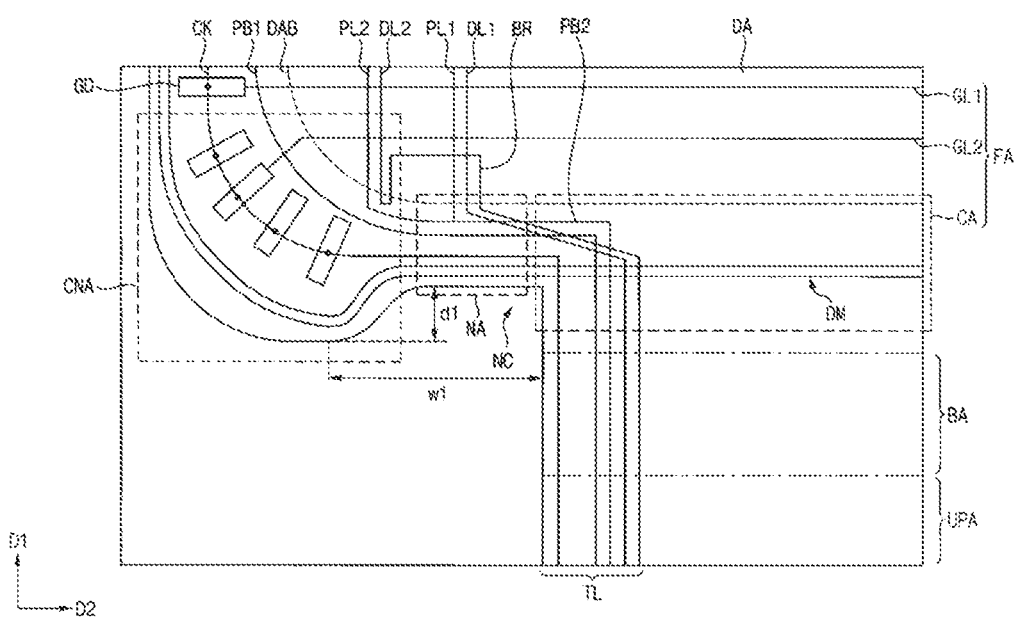
FIG. 5 is a partial plan view illustrating a display panel according to some embodiments.
Figure 6:
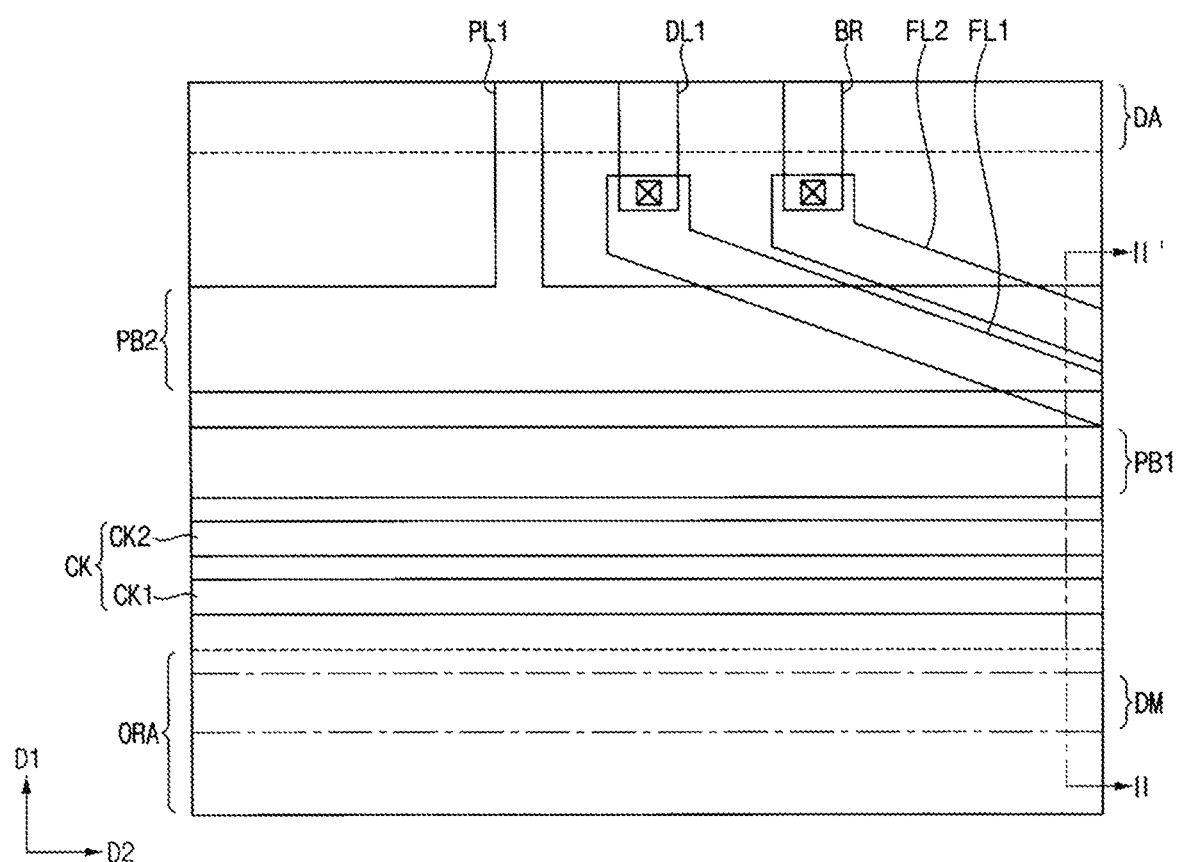
FIG. 6 is an enlarged plan view illustrating a notch area of FIG. 5 according to some embodiments.
Figure 7:
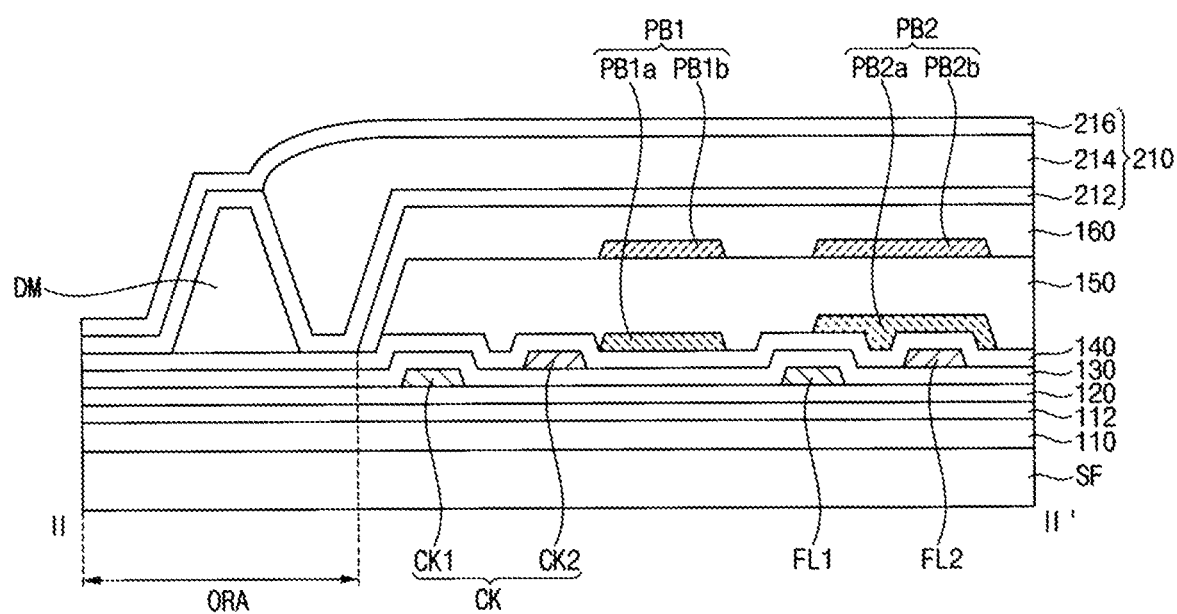
FIG. 7 is a cross-sectional view taken along the line II-II' of FIG. 6 according to some embodiments.

FIG. 5 is a partial plan view illustrating a display panel according to some embodiments. FIG. 6 is an enlarged plan view illustrating a notch area of FIG. 5. FIG. 7 is a cross-sectional view taken along the line II-II' of FIG. 6.

Referring to FIG. 5, a display panel may include a front portion FA, a bending portion BA connected to the front portion and a rear portion UPA extending from the bending portion BA. The front portion FA may include a display area DA and a peripheral area. In FIG. 5, the display area DA may be distinguished from the peripheral area by a display area boundary DAB. According to some embodiments, the display area DA may be an area at which images are displayed and may be defined by a display surface entirely having a two-dimensional shape. Embodiments according to the present disclosure, however, are not necessarily limited thereto, and according to some embodiments the display surface may include a primary display surface and one or more secondary display surfaces or curvatures that extend or curve from the primary display surface. According to some embodiments, the display area DA may have a rectangular shape, and in some embodiments, the display area DA may include one or more corner areas that are round or chamfered. The peripheral area may surround the display area DA and may be an area at which images are not displayed. For example, the peripheral area may have a rectangular frame shape, of which corners area round or chamfered, to correspond to, or follow a contour of, a shape of the display area DA.

Data lines extending along a first direction D1 and scan lines extending along a second direction D2 crossing the first direction D1 may be located in the display area DA. Furthermore, power lines extending along the first direction D1 may be located in the display area DA.

A scan driver GD, a scan driving wiring CK, a first power transfer wiring PB1, a second power transfer wiring PB2 and a fan-out wiring may be located in the peripheral area.

The scan driver GD may provide scan signals to the scan lines. For example, the scan driver GD may include a plurality of driving circuits, which each provides a scan signal to each scan lines.

The scan driving wiring CK may transfer a scan driving signal to the scan driver GD. According to some embodiments, the scan driving signal may include a clock signal. The scan driving wiring CK may include a plurality of signal lines.

The first power transfer wiring PB1 may transfer a first power voltage to the second electrode EL2 of the light-emitting element 200. The first power transfer wiring PB1 may have a shape surrounding at least a portion of the display area DA. For example, when the display area DA includes a round corner, the first power transfer wiring PB1 may include a curving portion extending along the round corner of the display area DA.

The second power transfer wiring PB2 may transfer a second power voltage to the power lines. The second power voltage may be transferred to a driving element of each pixels through the power lines. The driving element may generate a driving voltage based on the second power voltage. The driving voltage may be transferred to the first electrode EL1 of the light-emitting element. The second power transfer wiring PB2 may extend along a side of the display area DA. For example, when the display area DA includes a round corner, the second power transfer wiring PB2 may include a curving portion extending along the round corner of the display area DA.

The fan-out wiring may include a plurality of fan-out lines transferring data signals to the data lines. According to some embodiments, a portion of the fan-out lines may be electrically connected to a connection wirings BR so that a portion of the data lines may receive data signal through the connection wirings BR. At least a portion of the connection wiring BR is located in the display area DA, and extends along the second direction D2 to cross at least one of the data lines.

For example, referring to FIGS. 5 and 6, a first fan-out line FL1 may be electrically connected to a first data line DL1. A second fan-out line FL2 may be electrically connected to the connection wiring BR. The connection wiring BR may include a first vertical-extending portion and a first horizontal-extending portion. The first vertical-extending portion may extend along the first direction D1 in the display area DA. The first horizontal-extending portion may extend along the second direction D2 from an end of the first vertical-extending portion. The first horizontal-extending portion may cross the first data line DL1. The connection wiring BR may further include a second vertical-extending portion and a second horizontal-extending portion. The second vertical-extending portion may extend along the first direction D1 from an end of the first horizontal-extending portion toward the peripheral area. The second horizontal-extending portion may be located in the peripheral area, and may electrically contact a second data line DL2 and an end of the second vertical-extending portion.

According to some embodiments, the vertical-extending portions of the connection wiring BR and the data lines may be formed from a same layer as the second source metal pattern. Thus, the vertical-extending portions of the connection wiring BR and the data lines may be located in a same layer as the connection electrode CE. Furthermore, the horizontal-extending portions of the connection wiring BR may be formed from a same layer as the first source metal pattern. Thus, the horizontal-extending portions of the connection wiring BR may be located in a same layer as the source pattern SP and the drain pattern DP.

A transfer wiring TL may be located on the bending portion BA and the rear portion UPA to transfer the scan driving signal, the power voltage and the data signal to the scan driving wiring CK, the first power transfer wiring PB1, the second power transfer wiring PB2 and the fan-out wiring.

According to some embodiments, the peripheral area PA includes a corner area CNA, a connection area CA and a notch area NA. The corner area CNA may be adjacent to a corner of the display area DA. A portion of the scan driver GD may be located in the corner area CNA. The scan driver GD may be arranged along a curving line or a diagonal line, which corresponds to a corner of the display area DA in the corner area CNA.

The connection area CA may be defined by an area connected to the bending portion BA or by an area between the display area DA and the bending portion BA.

The notch area NA may be defined by an area adjacent to a notch NC of the display panel to have a smaller width than areas adjacent thereto. According to some embodiments, the notch area NA may be adjacent to the corner area CNA. For example, the notch area NA may be located between the corner area CNA and the connection area CA. A width of the notch area NA along the first direction D1 may be smaller than widths of the corner area CNA and the connection area CA along the first direction D1. Thus, a distance between the display area DA an outer edge of the notch area NA along the first direction D1 may be smaller than a distance between the display area DA an outer edge of the corner area CNA along the first direction D1. For example, the outer edge of the notch area NA may recede from the outer edge of the corner area CNA toward the display area DA. For example, a length (width) d1 of the notch may be about 50 μm to about 150 μm. When the length d1 of the notch is excessively small, adhesion between a sealing member and a window cover may be reduced. When the length d1 of the notch is excessively large, it may be difficult to obtain a space for wirings. A width w1 of the notch area NA or the notch NC along the second direction D2 may be about 50 μm to about 500 μm. However, embodiments are not limited thereto, and a size and a design of the notch may be variously changed as desired.

According to some embodiments, the display area DA may have a rectangular shape, of which corners are round or chamfered. Thus, a column adjacent to the corners may have smaller pixels than pixels arranged in a column far from the corners, and a row adjacent to the corners may have smaller pixels than pixels arranged in a row far from the corners. Thus, a second data line DL2 adjacent to the corner area CNA of the peripheral area may have a smaller length than a length of a first data line DL1 far from the corner area CNA. Furthermore, a second gate line GL2 adjacent to the corner area CNA may have a smaller length than a length of a first gate line GL1 far from the corner area CNA. Furthermore, a second power line PL2 adjacent to the corner area CNA may have a smaller length than a length of a first power line PL1 far from the corner area CNA. The first data line DL1 may be directly connected to the first fan-out line FL1. The second data line DL2 may be electrically connected to the second fan-out line FL2 through the connection wiring BR.

However, embodiments according to the present disclosure are not limited thereto. For example, the first data line DL1 and the second data line DL2 may have a substantially same length. The first gate line GL1 and the second gate line GL2 may have a substantially same length. The first power line PL1 and the second power line PL2 may have a substantially same length.

A dam structure DM may be located in the peripheral area. The dam structure DM may have a shape surrounding the display area DA in a plan view. The scan driver GD, the scan driving wiring CK, the first power transfer wiring PB1, the second power transfer wiring PB2 and at least a portion of the fan-out wiring may be located between the dam structure DM and the display area DA.

According to some embodiments, the dam structure DM may extend along an edge of the peripheral area. Because the display panel includes the notch NC, the dam structure DM may recede inwardly in the notch area NA, or may protrude outwardly in the corner area CNA.

Referring to FIGS. 6 and 7, a buffer layer 112, a first insulation layer 120, a second insulation layer 130, a third insulation layer 140, a fourth insulation layer 150, a fifth insulation layer 160 and an encapsulation layer 210 may be located on the base substrate 110 in a notch area NA. The buffer layer 112, the first insulation layer 120, the second insulation layer 130, the third insulation layer 140, the fourth insulation layer 150, the fifth insulation layer 160 and the encapsulation layer 210 may extend from the display area DA.

A scan driving wiring CK, a first power transfer wiring PB1, a second power transfer wiring PB2, a fan-out siring and a dam structure DM may be located in the notch area NA.

For example, the scan driving wiring CK may include a first scan driving line CK1 and a second scan driving line CK2. The first scan driving line CK1 and the second scan driving line CK2 may be spaced apart from each other along a first direction D1 and may extend along a second direction D2 crossing the first direction D1.

The first scan driving line CK1 and the second scan driving line CK2 may be arranged in different layers. For example, the first scan driving line CK1 may be formed from a same layer as the first gate metal pattern. Thus, the first scan driving line CK1 may be located between the first insulation layer 120 and the second insulation layer 130. The second scan driving line CK2 may be formed from a same layer as the second gate metal pattern. Thus, the second scan driving line CK2 may be located between the third insulation layer 140 and the second insulation layer 130.

According to some embodiments, at least one of the first power transfer wiring PB1 or the second power transfer wiring PB2 may have a dual-wiring structure.

For example, the first power transfer wiring PB1 may include a lower wiring layer PB1a and an upper wiring layer PB1b located on the lower wiring layer PB1a. In an area, the lower wiring layer PB1a and the upper wiring layer PB1b may be spaced apart from each other by the fourth insulation layer 150. In another area, the lower wiring layer PB1a and the upper wiring layer PB1b may electrically contact each other. According to some embodiments, the lower wiring layer PB1a may be formed from a same layer as the first source metal pattern. Thus, the lower wiring layer PB1a may be located between the third insulation layer 140 and the fourth insulation layer 150. The upper wiring layer PB1b may be formed from a same layer as the second source metal pattern. Thus, upper wiring layer PB1b may be located between the fourth insulation layer 150 and the fifth insulation layer 160.

For example, the second power transfer wiring PB2 may include a lower wiring layer PB2a and an upper wiring layer PB2b located on the lower wiring layer PB2a. In an area, the lower wiring layer PB2a and the upper wiring layer PB2b may be spaced apart from each other by the fourth insulation layer 150. In another area, the lower wiring layer PB2a and the upper wiring layer PB2b may electrically contact each other. According to some embodiments, the lower wiring layer PB2a may be formed from a same layer as the first source metal pattern. Thus, the lower wiring layer PB2a may be located between the third insulation layer 140 and the fourth insulation layer 150. The upper wiring layer PB2b may be formed from a same layer as the second source metal pattern. Thus, upper wiring layer PB2b may be located between the fourth insulation layer 150 and the fifth insulation layer 160.

For example, a first power line PL1 may be continuously connected to the upper wiring layer PB2b of the second power transfer wiring PB2.

The fan-out wiring may include a plurality of fan-out lines. For example, the fan-out wiring may include a first fan-out line FL1 electrically contacting a first data line DL1 and a second fan-out line FL2 electrically contacting a connection wiring BR.

The first fan-out line FL1 and the second fan-out line FL2 may be arranged in different layers. For example, the first fan-out line FL1 may be formed from a same layer as the first gate metal pattern. Thus, the first fan-out line FL1 may be located between the first insulation layer 120 and the second insulation layer 130. The second fan-out line FL1 may be formed from a same layer as the second gate metal pattern. Thus, the second fan-out line FL1 may be located between the third insulation layer 140 and the second insulation layer 130.

According to some embodiments, at least a portion of the fan-out wiring may overlap at least one of the power transfer wirings PB1 or PB2.

The peripheral area may include an organic-layer-disconnected area ORA. In the organic-layer-disconnected area ORA, an organic layer except for the dam structure may be removed. For example, the fourth insulation layer 150 and the fifth insulation layer 160 may be excluded in the organic-layer-disconnected area ORA.

The organic-layer-disconnected area ORA may have a shape surrounding the display area DA in a plan view. Thus, instances of moisture or other contaminants entering the display area DA along an organic layer may be prevented or reduced.

The dam structure DM may be arranged along the organic-layer-disconnected area ORA. The dam structure DM may prevent or reduce instances of a liquid monomer composition overflowing when an organic thin film 214 of the encapsulation layer 210 is formed. For example, a location of an outer edge of the organic thin film 214 may be controlled by the dam structure DM. Inorganic thin films 212 and 216 of the encapsulation layer 210 may extend outwardly over the dam structure DM.

The dam structure DM may include an organic insulation material. For example, the dam structure DM may be formed from a same layer as the fourth insulation layer 150, the fifth insulation layer 160 or a combination thereof.

Figure 8:
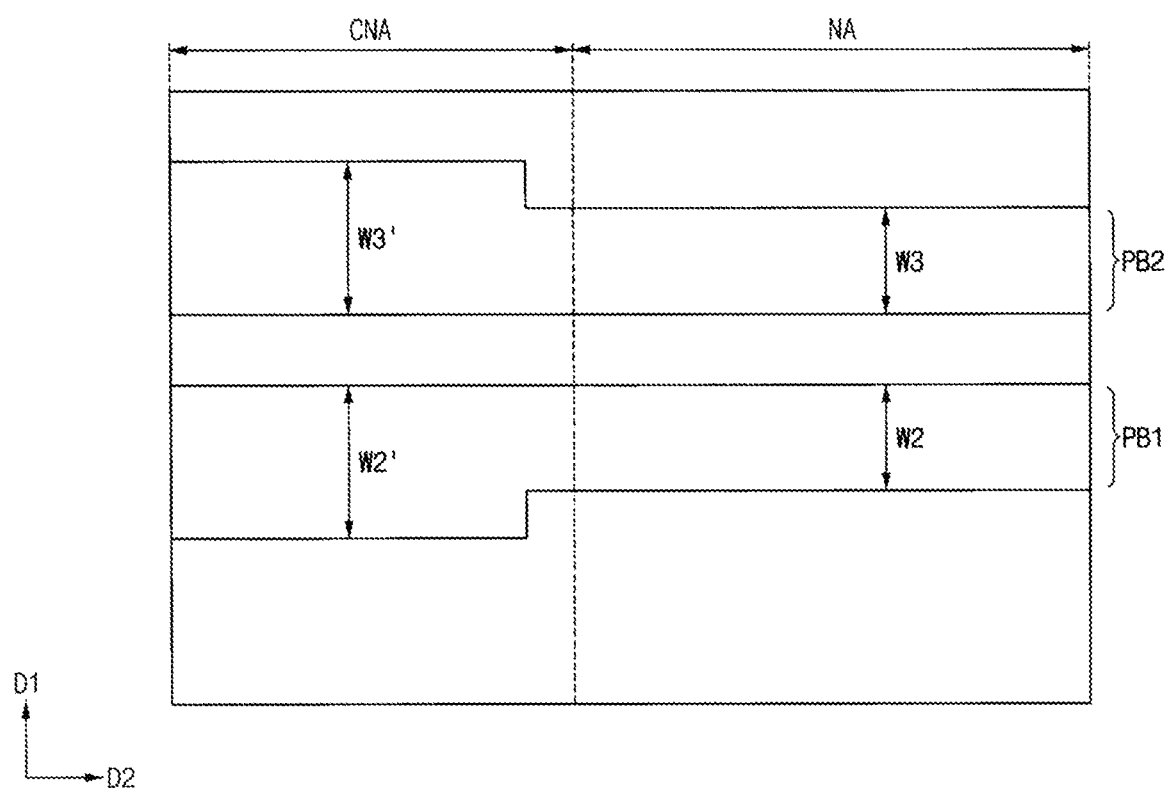
FIG. 8 is an enlarged plan view partially illustrating a power transfer wiring of a display panel according to some embodiments.

FIG. 8 is an enlarged plan view partially illustrating a power transfer wiring of a display panel according to some embodiments.

Referring to FIG. 8, a first power transfer wiring PB1 and a second power transfer wiring PB2 may extend continuously in a corner area CNA and a notch area NA.

At least one of the first power transfer wiring PB1 or the second power transfer wiring PB2 may have a width variance. For example, the first power transfer wiring PB1 may have a width W2' in the corner area CNA, which is larger than a width W2 in the notch area NA. The second power transfer wiring PB2 may have a width W3' in the corner area CNA, which is larger than a width W3 in the notch area NA.

According to some embodiments, a width of a power transfer wiring may be selectively reduced in a notch area having a smaller width to minimize, prevent, or reduce increases of resistance.

Figure 9:
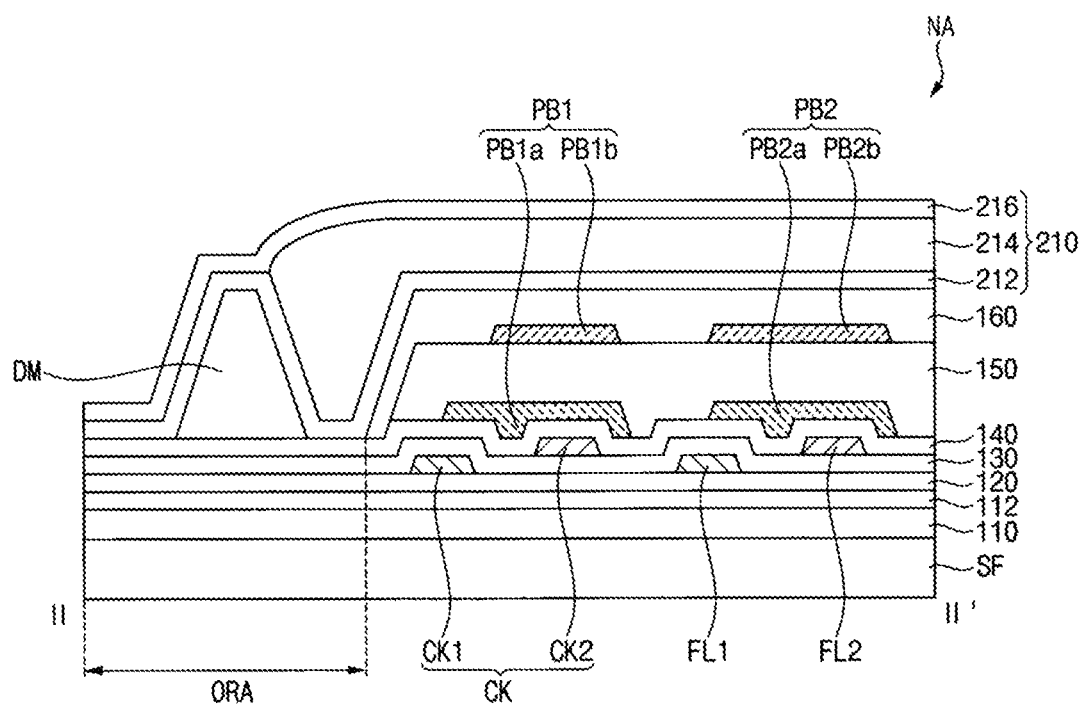
FIG. 9 is an enlarged cross-sectional view illustrating a notch area of a display panel according to some embodiments.

FIG. 9 is an enlarged cross-sectional view illustrating a notch area of a display panel according to some embodiments.

Referring to FIG. 9, a first power transfer wiring PB1 may overlap a scan driving wiring CK in a notch area NA. Thus, a width of the notch area NA may be further reduced.

Figure 10:
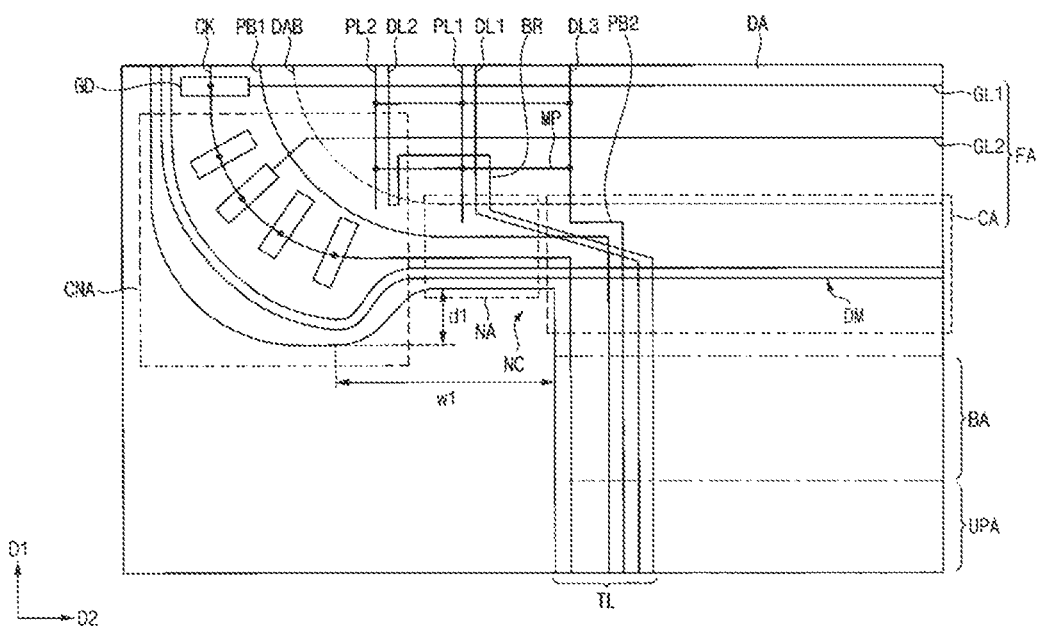
FIG. 10 is a plan view partially illustrating a display panel according to some embodiments.
Figure 11:
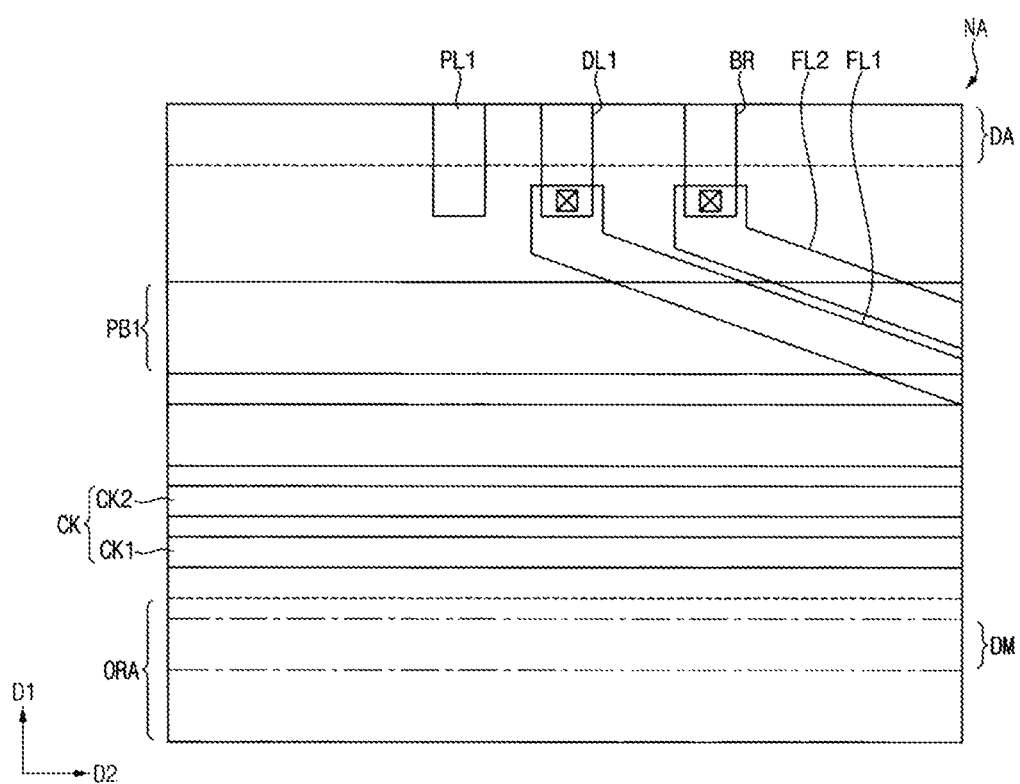
FIG. 11 is an enlarged plan view illustrating a notch area of FIG. 10 according to some embodiments.

FIG. 10 is a plan view partially illustrating a display panel according to some embodiments. FIG. 11 is an enlarged plan view illustrating a notch area of FIG. 10.

Referring to FIGS. 10 and 11, a second power transfer wiring PB2 electrically connected to a power line located in a display area DA may not be located in a notch area NA.

For example, a second power transfer wiring PB2 may be located selectively in a connection area CA of a peripheral area, which is connected to a bending portion BA. The second power transfer wiring PB2 may electrically contact a third power line PL3 adjacent to the connection area CA and extending along a first direction D1. A mesh power wiring MP may be located in a display area DA. The mesh power wiring MP electrically contacts the third power line PL3 and extends along a second direction D2 crossing the first direction D1. The mesh power wiring MP may electrically contact a first power line PL1 adjacent to the notch area NA and a second power line PL2 adjacent to a corner area CNA. Thus, a power voltage may be applied to the first power line PL1 and the second power line PL2 through the mesh power wiring MP.

For example, the power lines PL1, PL2 and PL3 may be formed from a same layer as a second source metal pattern, and the mesh power wiring MP may be formed from a same layer as a first source metal pattern.

Because the second power transfer wiring PB2 is not located in the notch area NA, a first power transfer wiring PB1 and a scan driving wiring CK may be moved or recede toward the display area DA. Thus, a width of the notch area NA along the first direction D1.

Figure 12:
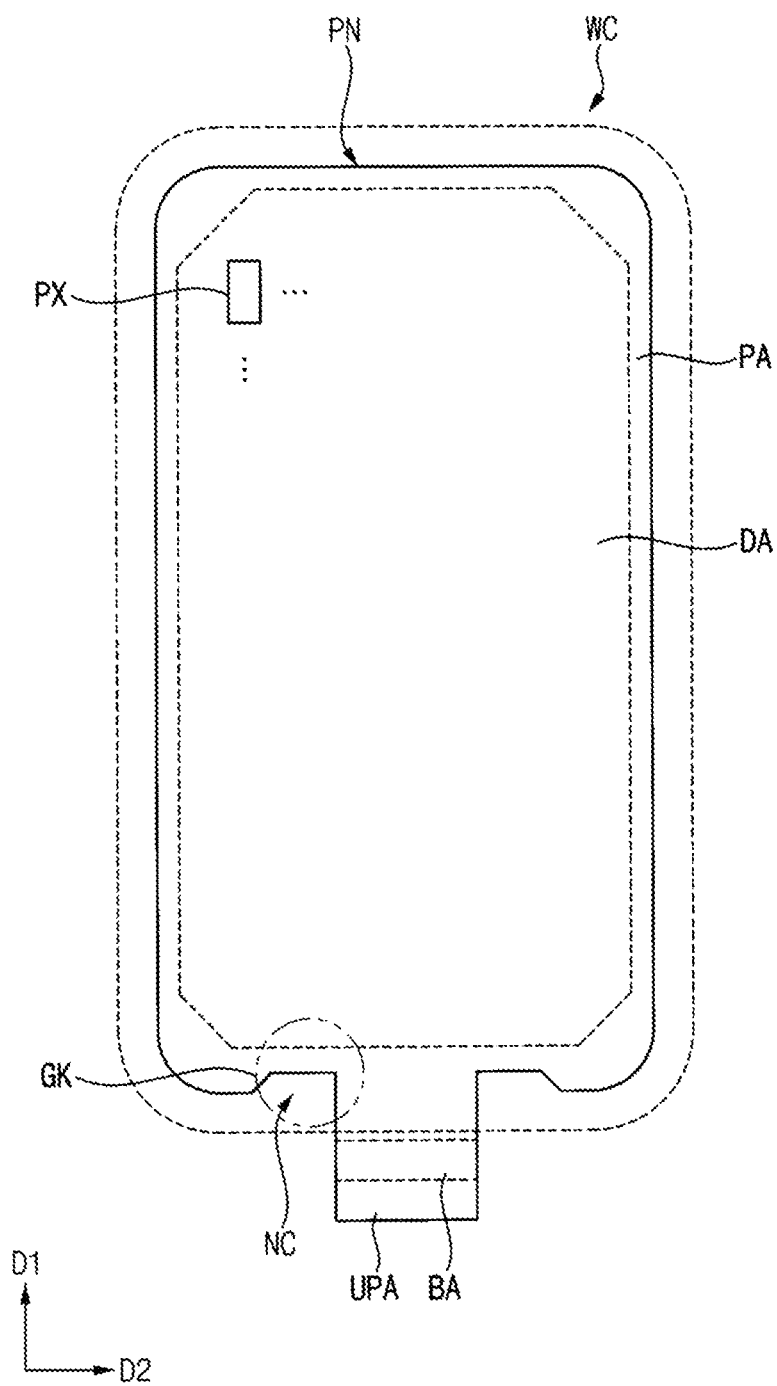
FIGS. 12 and 13 are plan views illustrating display panels according to some embodiments.
Figure 13:
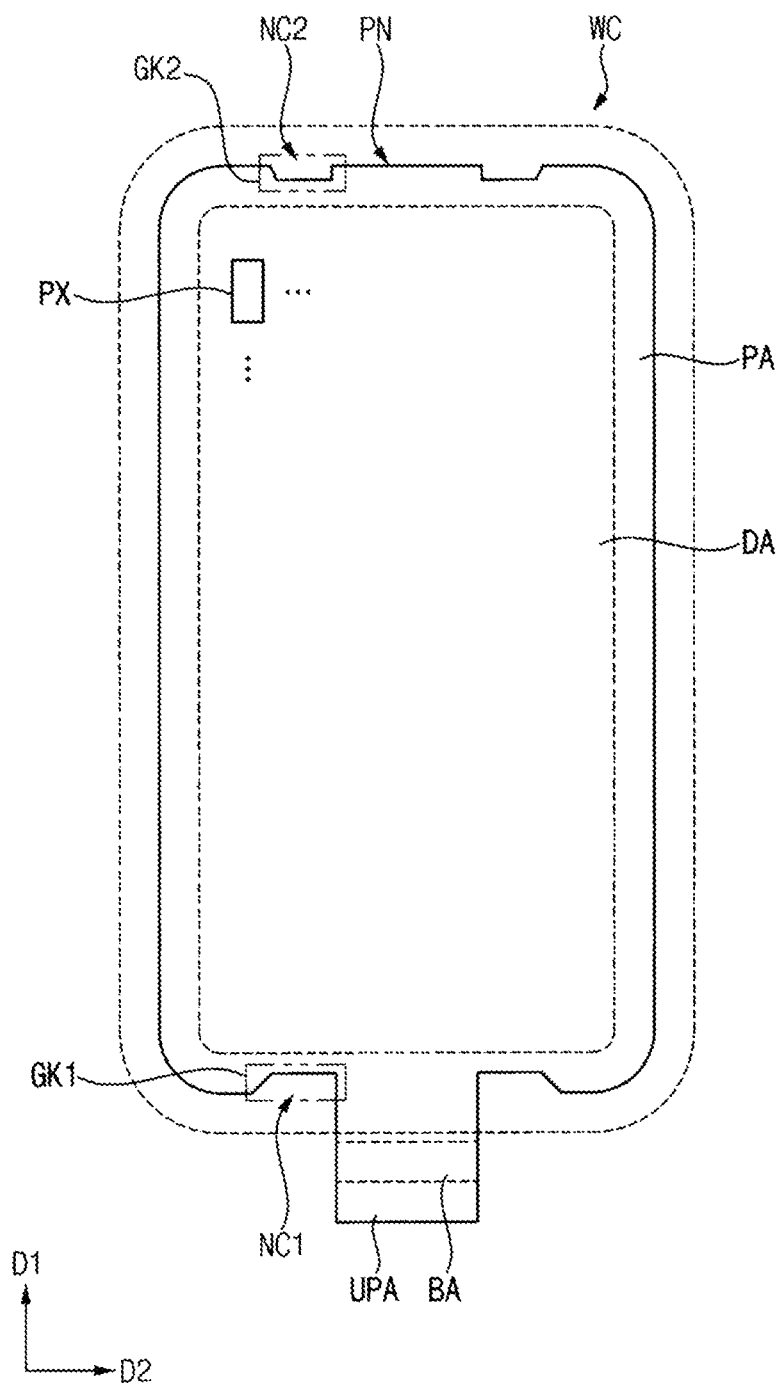

FIGS. 12 and 13 are plan views illustrating display panels according to embodiments.

Referring to FIG. 12, a display area DA of a display panel PN may have a corner with a chamfered shape. A scan driver may be arranged along the corner of the display area DA in a corner area of a peripheral area PA. An edge of the corner area may have a round shape or a chamfered shape.

Referring to FIG. 13, a notch may be formed at a side of a display panel PN, which is opposite to a bending portion BA. For example, the display panel PN may include a first notch NC1 formed at a first side adjacent to the bending portion BA and a second notch NC2 formed at a second side opposite to the first side.

According to some embodiments, a display device may include a window cover WC covering a front surface of the display panel PN and a rear cover covering a rear surface of the display panel PN. Water-proof members may be located between the window cover WC and the rear cover, and a sealing member may be provided to fill a gap between the water-proof members. The sealing member may overlap the first and second notches NC1 and NC2 of the display panel PN.

For example, a first sealing member GK1 may overlap the first notch NC1 to contact the window cover WC through the first notch NC1. A second sealing member GK2 may overlap the second notch NC2 to contact the window cover WC through the second notch NC2.

Embodiments are not limited to the above-explained organic light-emitting display devices. For example, embodiments may include various display devices such as a liquid crystal display device, an inorganic electro-luminescent display device, a micro-LED display device or the like.

Embodiments may be applied to various display devices. For example, aspects of some embodiments may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the present inventive concept. Accordingly, all such modifications are intended to be included within the scope of embodiments according to the present inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the present inventive concept, as set forth in the following claims and equivalents thereof.

What is claimed is:

1. A display panel comprising:
   a plurality of pixels in a display area;
   a plurality of data lines in the display area and extending along a first direction;
   a plurality of scan lines in the display area and extending along a second direction crossing the first direction; and
   a scan driver in a peripheral area adjacent to the display area and configured to provide a scan signal to the scan lines,
   wherein the peripheral area includes a corner area adjacent to a corner of the display area, a connection area in which transfer wirings are located, the transfer wirings being configured to at least transfer data signals to the data lines, and a notch area adjacent to the corner area and receding from a side of the peripheral area to form a notch,
   wherein the notch is located between the corner area and the connection area.

2. The display panel of claim 1, wherein a width of the notch along the first direction is 50 μm to 150 μm.

3. The display panel of claim 2, wherein a width of the notch along the second direction is 50 μm to 500 μm.

4. The display panel of claim 1, wherein the display panel includes a bending portion extending from the peripheral area, and a rear portion extending from the bending portion and under a front portion including the display area.

5. The display panel of claim 4, wherein the connection area is connected to the bending portion.

6. The display panel of claim 1, wherein the display area includes a corner with a round shape or a chamfered shape.

7. The display panel of claim 6, wherein the scan driver is arranged along a curving line or a diagonal line, which corresponds to the corner of the display area, in the corner area of the peripheral area.

8. The display panel of claim 1, further comprising:
   a scan driving wiring passing through the notch area and electrically connected to the scan driver;
   a first power transfer wiring passing through the notch area and transferring a first power voltage to the pixels;
   a plurality of power lines in the display area and electrically connected to the pixels; and
   a second power transfer wiring in the peripheral area and electrically connected to the power lines.

9. The display panel of claim 8, wherein the second power transfer wiring passes through the notch area.

10. The display panel of claim 8, further comprising a mesh power wiring in the display area and extending along the second direction, wherein the mesh power wiring is electrically connected to the power lines, wherein the second power transfer wiring is not in the notch area.

11. The display panel of claim 8, further comprising a connection wiring in the display area and configured to transfer a data signal to a data line adjacent to the corner area.

12. The display panel of claim 11, wherein the connection wiring is electrically connected to the data line adjacent to the corner area.

13. The display panel of claim 12, wherein a portion of the connection wiring extends along the second direction to cross a data line adjacent thereto.

14. The display panel of claim 8, wherein at least one of the first power transfer wiring or the second power transfer wiring have a dual-wiring structure including an upper wiring layer and a lower wiring layer.

15. The display panel of claim 8, wherein the first power transfer wiring overlaps the scan driving wiring in the notch area.

16. The display panel of claim 8, wherein at least one of the first power transfer wiring or the second power transfer wiring has a width along the first direction in the corner area, which is larger than a width along the first direction in the notch area.

17. A display device comprising:
a display panel including a notch receding from a side of the display panel;
a window cover combined with a front surface of the display panel;
a rear cover on a rear surface of the display panel; and
a sealing member located between the window cover and the rear cover and overlapping the notch of the display panel.

18. The display device of claim 17, wherein the sealing member includes a cured resin.

19. The display device of claim 17, further comprising at least one water-proof member between the display panel and the rear cover or between the window cover and the rear cover.

20. The display device of claim 17, wherein the display panel includes:
a plurality of pixels in a display area;
a plurality of data lines in the display area and extending along a first direction;
a plurality of scan lines in the display area and extending along a second direction crossing the first direction; and
a scan driver in a peripheral area adjacent to the display area and providing a scan signal to the scan lines,
wherein the peripheral area includes a corner area adjacent to a corner of the display area, and a notch area adjacent to the corner area and receding from a side of the peripheral area to form the notch,
wherein a distance between the display area and an outer edge of the corner area is larger than a distance between the display area and an outer edge of the notch area.

\* \* \* \* \*